United States Patent [19]

Miwada

[11] Patent Number: 5,276,723
[45] Date of Patent: Jan. 4, 1994

[54] FLOATING DIFFUSION TYPE CHARGE DETECTION CIRCUIT FOR USE IN CHARGE TRANSFER DEVICE

[75] Inventor: Kazuo Miwada, Tokyo, Japan

[73] Assignee: NEC Corporation, Tokyo, Japan

[21] Appl. No.: 699,836

[22] Filed: May 14, 1991

[30] Foreign Application Priority Data

May 14, 1990 [JP] Japan .................. 2-123692

[51] Int. Cl.$^5$ .................. G11C 19/28; H01L 29/78
[52] U.S. Cl. .................. 377/60; 377/63; 377/58; 257/239
[58] Field of Search .................. 377/57–63; 357/24; 307/358, 359, 491, 548, 568; 330/156, 277, 292; 257/239

[56] References Cited

U.S. PATENT DOCUMENTS

| | | | |
|---|---|---|---|
| 3,623,132 | 11/1971 | Green | 377/60 |
| 4,074,206 | 2/1978 | Horninger | 377/60 |
| 4,303,839 | 12/1981 | Berger et al. | 377/58 |
| 4,508,975 | 4/1985 | Rockett, Jr. | 377/62 |
| 4,700,085 | 10/1987 | Miwada | 307/362 |
| 4,814,648 | 3/1989 | Hynecek | 377/63 |
| 4,974,239 | 11/1990 | Miwada | 377/63 |
| 5,029,190 | 7/1991 | Narabu et al. | 377/60 |

FOREIGN PATENT DOCUMENTS

| | | | |
|---|---|---|---|
| 0128095 | 7/1983 | Japan | 377/63 |
| 0185094 | 10/1984 | Japan | 377/62 |
| 0230747 | 9/1990 | Japan | 307/607 |
| 0303000 | 12/1990 | Japan | 377/63 |

*Primary Examiner*—William L. Sikes
*Assistant Examiner*—Tai V. Duong
*Attorney, Agent, or Firm*—Sughrue, Mion, Zinn, Macpeak & Seas

[57] ABSTRACT

A floating diffusion type signal charge detection circuit for use in a charge transfer device includes a charge transfer region formed in a semiconductor layer, a plurality of transfer electrodes formed on the charge transfer region through an insulating layer, a floating diffusion formed in the semiconductor layer adjacent to a final stage of the charge transfer region, a reset drain formed in the semiconductor layer separate from the floating diffusion and connected to a reset drain voltage, and a reset gate formed through an insulating layer on a portion of the semiconductor layer between the floating diffusion and the reset drain. The floating diffusion, the reset drain and the reset gate forms a reset transistor. An amplifier is connected at its input to the floating diffusion so as to detect a voltage change appearing in the floating diffusion. The amplifier includes a first amplification stage having a first MOS transistor having a gate connected to the floating diffusion and a drain connected to a high voltage, a source of the first MOS transistor being connected to a first load so that a first source follower is formed, and a second amplification stage having an input connected to the source of the first MOS transistor and an output node connected to an output terminal. An output control circuit is connected to the first MOS transistor and controlled in synchronism with a reset pulse applied to the reset gate so that when the reset transistor is off, the first source follower outputs an signal having a level higher than that outputted from the first source follower when the reset transistor were on.

8 Claims, 3 Drawing Sheets

FLOATING DIFFUSION TYPE CHARGE DETECTION CIRCUIT FOR USE IN CHARGE TRANSFER DEVICE

BACKGROUND OF THE INVENTION

1. Field of the invention

The present invention relates to a charge transfer device for use in a solid state image sensor, and more specifically to a floating diffusion type signal charge detection circuit for use in a charge transfer device.

2. Description of related art

One typical example of a charge transfer device used in for example a linear or area image sensor comprises a CCD (charge coupled device) shift register formed together with an image sensor cell array so that signal charges stored in the image sensor cell array are transferred to the CCD shift register, and then transferred through the CCD shift register by applying a multiphase transfer pulse to transfer electrodes of the CCD register. The signal charges transferred through the CCD shift register are serially outputted from an output gate electrode provided adjacent to a transfer electrode formed on a charge transfer region of a final stage of the CCD shift register.

A floating diffusion is provided adjacent to the output gate electrode. The floating diffusion forms a source of a reset MOS transistor, which is used to bring a potential of the floating diffusion to the same as that of the drain of the reset MOS transistor before each time the signal charge is transferred to the floating diffusion. In addition, the floating diffusion is connected to an input of an amplifier circuit, which is formed of, for example, a source follower.

In the above mentioned floating diffusion type signal charge detection circuit for use in the charge transfer device, when a transfer pulse of the transfer electrode of the final stage of the CCD shift register is maintained at a high level, a reset pulse of a high level is applied to a gate of the reset MOS transistor so as to turn on the reset MOS transistor, so that the source voltage of the reset MOS transistor, namely the voltage of the floating diffusion, called $V_p$ here, is brought into the same potential as a drain voltage $V_{RD}$ of the reset MOS transistor. Thereafter, the reset pulse is brought into a low level so as to turn off the reset transistor, so that the floating diffusion is put into a floating condition. In the condition, the transfer pulse of the transfer electrode of the final stage of the CCD shift register is brought to a low level, so that signal charges stored in the transfer electrode of the final stage of the CCD shift register is caused to flow, through a channel formed under the output gate, into the floating diffusion. As a result, a potential change $\Delta V$ out is caused in the floating diffusion by the inflow signal charges, and the potential change $\Delta V$ out forms a signal output.

In the above mentioned arrangement of the signal charge detection circuit, however, since a coupling capacitance exists between the gate of the reset MOS transistor and the floating diffusion, when the reset pulse is brought from the high level to the low level, the potential of the floating diffusion sustains a potential drop $\Delta \phi_R$ called a "reset feedthrough noise". In ordinary cases, this potential drop $\Delta \phi_R$ due to the "reset feedthrough noise" is a few hundreds millivolts, which is a substantial value in comparison with a net signal output voltage $\Delta V$ out which is in a range of a few tens millivolts to a few hundreds millivolts.

Generally, the signal output is supplied through a sample/hold circuit to an A/D (analog-to-digital) converter. In this case, in order to cause a level of the signal output to adapt to an input level of the A/D converter, the signal output is amplified by an amplifier. For example, if the signal output $\Delta V$ out is on the order of a few tens millivolts, the signal output is amplified a few tens times. In this amplification, the reset feedthrough noise $\Delta \phi_R$ is also amplified a few tens times, so that the component of the reset feedthrough noise $\Delta \phi_R$ reaches a few tens volts.

In general, since the amplifier connected to the signal charge detection circuit is required to have a wide dynamic range and an excellent frequency characteristics, an amplifier capable of complying with a large signal becomes high in cost. As a result, the degree of amplification in the amplifier actually had to be limited within a range of several times. In this case, however, if the level of the signal output is low in comparison with a reference voltage of the A/D converter, a quantizing error becomes large and a S/N (signal-to-noise) ratio lowers. In order to solve this problem, it may be considered to lower the reference voltage of the A/D converter. However, this method is not preferable, since the precision of the A/D convertor lowers, with the result that the S/N ratio lowers.

SUMMARY OF THE INVENTION

Accordingly, it is an object of the present invention to provide a signal charge detection circuit of the charge transfer device, which has overcome the above mentioned defect of the conventional one.

Another object of the present invention is to provide a floating diffusion type signal charge detection circuit of the charge transfer device, capable of sufficiently suppressing the reset feedthrough noise, so that even if an output signal of a charge transfer device is small, an amplification factor of an associated amplifier can be made to a few tens times, and a sufficiently high S/N ratio can be ensured.

The above and other objects of the present invention are achieved in accordance with the present invention by a floating diffusion type signal charge detection circuit for use in a charge transfer device. The signal charge detection circuit includes a charge transfer region formed in a semiconductor layer, a plurality of transfer electrodes formed on the charge transfer region through an insulating layer, a floating diffusion formed in the semiconductor layer adjacent to a final stage of the charge transfer region, a reset drain formed in the semiconductor layer separate from the floating diffusion and connected to a reset drain voltage, a reset gate formed through an insulating layer on a portion of the semiconductor layer between the floating diffusion and the reset drain, the floating diffusion, the reset drain and the reset gate forming a reset transistor, and an amplifier having an input connected to the floating diffusion so as to detect a voltage change appearing in the floating diffusion, the amplifier including a first amplification stage having a first MOS transistor having a gate connected to the floating diffusion and a drain connected to a high voltage, a source of the first MOS transistor being connected to a first load so that a first source follower is formed, and a second amplification stage having an input connected to the source of the first MOS transistor and an output node connected to an output terminal, and an output control circuit connected to the first MOS transistor and controlled in synchronism with a reset pulse applied to the reset gate so that when the reset transistor is off, the first source follower outputs an signal having a level higher than that outputted from the first source follower when the reset transistor were on.

The above and other objects, features and advantages of the present invention will be apparent from the following description of preferred embodiments of the invention with reference to the accompanying drawings.

DESCRIPTION OF THE PREFERRED EMBODIMENTS

Figure 1:
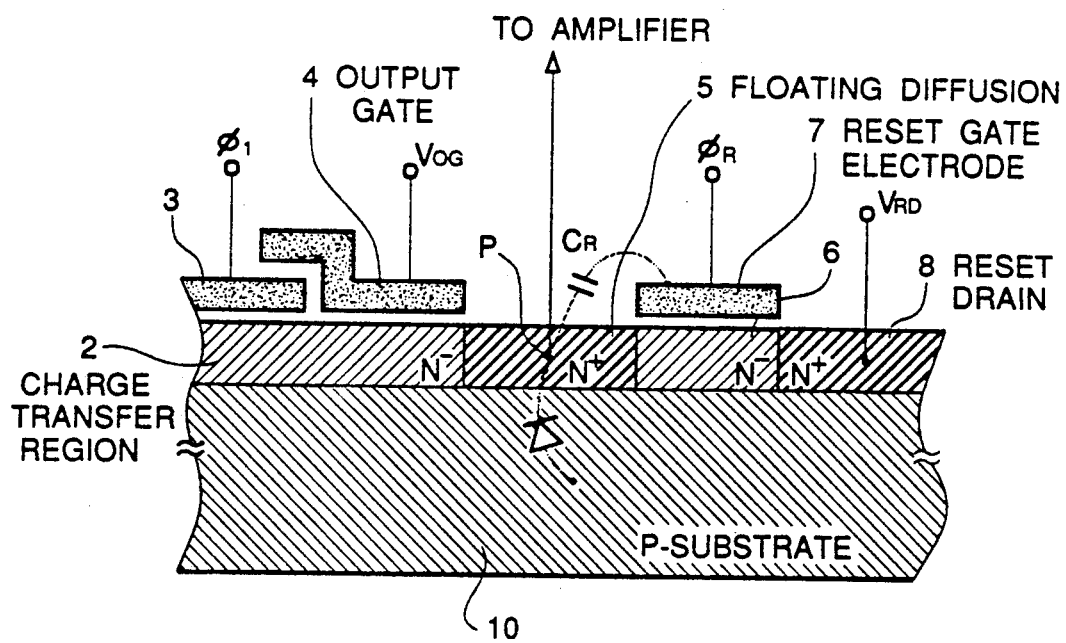
FIG. 1 is a diagrammatic sectional view illustrating a final stage of a CCD shift register and an associated floating diffusion and a reset transistor.

Referring to FIG. 1, there is shown a diagrammatic sectional view illustrating a final stage of a CCD shift register and an associated floating diffusion and a reset transistor.

The shown final stage of the CCD shift register includes a semiconductor substrate 10 of for example the P-type, and a charge transfer region 2 of the N_-type formed on the semiconductor substrate 10. On this transfer region 2, a plurality of transfer electrodes are formed through an insulating layer (not shown). For simplification of drawing, only a final one of the transfer electrodes is shown in FIG. 1 and given the Reference Numeral 3. Adjacent the final transfer electrode 3 of the final stage of the CCD shift register, an output gate 4 is provided on an end portion of the transfer region 2. Adjacent the transfer region 2, a floating diffusion 5 of the N+-type is formed in the semiconductor substrate 10. This floating diffusion 5 has a high impurity concentration. Furthermore, a region 6 of the N⁻-type is formed in the semiconductor substrate 10 adjacent to the floating diffusion 5, and a reset gate 7 is located on the region 6 through an insulating layer (not shown). In addition, a drain region 8 of the N+-type having a high impurity concentration is formed adjacent to the region 6. Thus, a buried channel CCD shift register is formed. In addition, the floating diffusion 5, the reset gate 7 and the drain region 8 form a reset MOS transistor of a depletion type. However, this reset MOS transistor is used in the mode of an enhancement mode.

Figure 2:
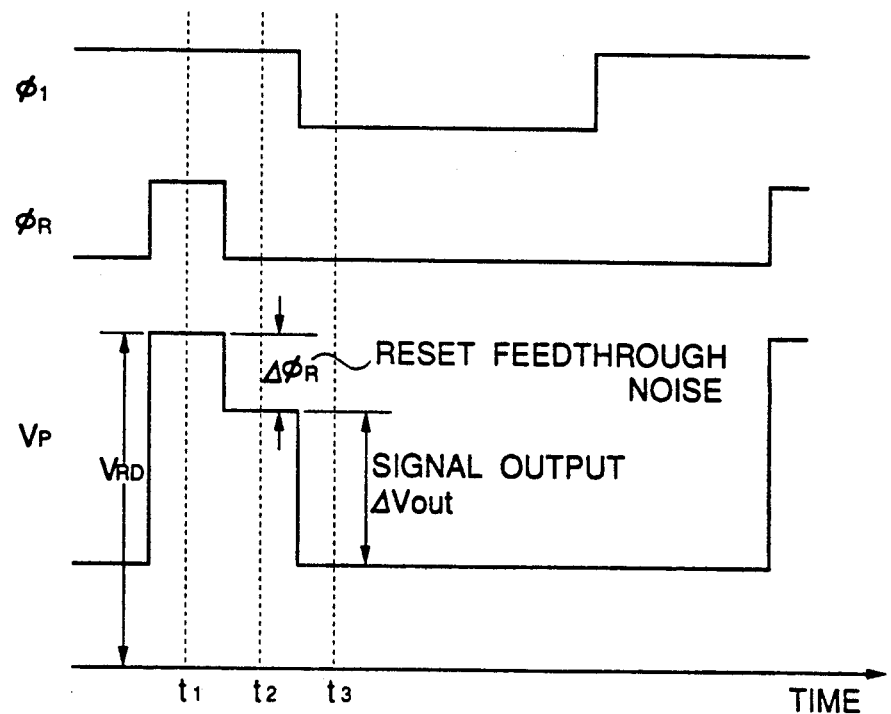
FIG. 2 is a waveform diagram illustrating the reset feedthrough noise.

A transfer clock $\phi_1$ is applied to the transfer electrode 3, as shown in FIG. 2, and the output gate 4 is biased to a constant gate voltage $V_{OG}$. In addition, a reset drain voltage $V_{RD}$ is supplied to the drain 8 of the reset MOS transistor, and a reset pulse $\phi_R$ is applied to the reset gate 7. The floating diffusion 5 is connected to an input of an amplifier (not shown in FIG. 1).

When the transfer pulse $\phi_1$ applied to the transfer electrode 3 of the final stage of the CCD shift register is maintained at a high level, at a time $t_1$ as shown in FIG. 2 the reset pulse $\phi_R$ of a high level is applied to the reset gate 7 of the reset MOS transistor so as to turn on the reset MOS transistor, so that the source voltage of the reset MOS transistor, namely a voltage Vp of the floating diffusion 5, is brought into the same potential as the drain voltage $V_{RD}$ of the reset MOS transistor. Thereafter, the reset pulse $\phi_R$ is brought into a low level so as to turn off the reset transistor, at a time $t_2$ as shown in FIG. 2, so that the floating diffusion 5 is put into a floating condition. In the condition, at a time $t_3$ as shown in FIG. 2, the transfer pulse $\phi_1$ applied to the transfer electrode 3 of the final stage of the CCD shift register is brought to a low level, so that signal charges stored under the transfer electrode 3 of the final stage of the CCD shift register is caused to flow, through a channel formed under the output gate 4, into the floating diffusion 5. As a result, a potential change $\Delta$Vout is caused in the floating diffusion 5 by the inflow signal charges, and the potential change $\Delta$Vout forms a signal output.

Figure 3:
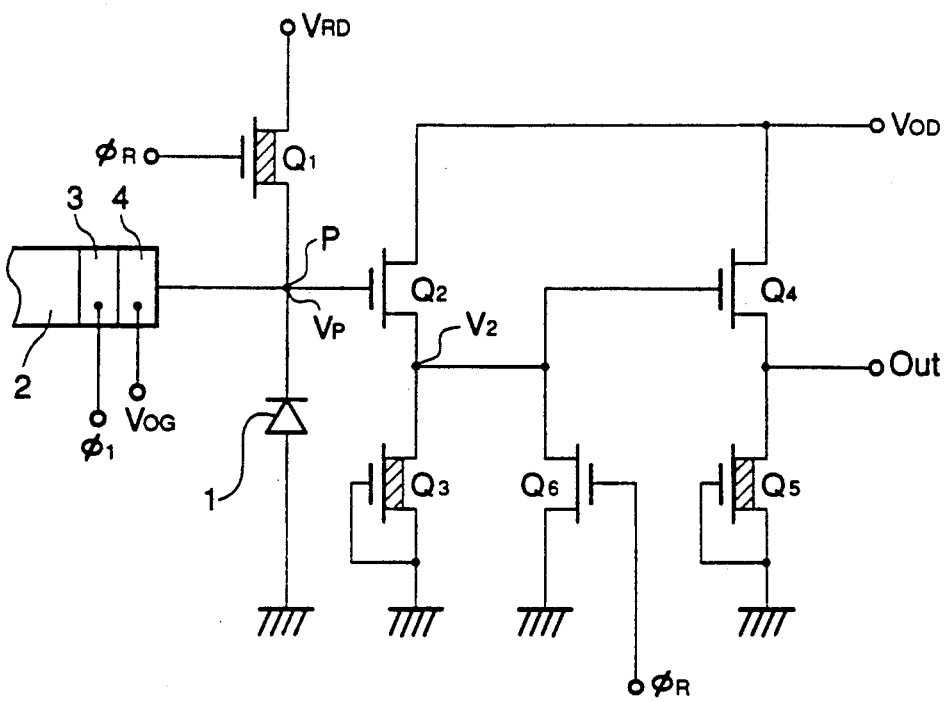
FIG. 3 is a circuit diagram of a first embodiment of the floating diffusion type signal charge detection circuit in accordance with the present invention for the charge transfer device.

In the above mentioned arrangement of the signal charge detection circuit, however, since a coupling capacitance $C_R$ exists between the reset gate 7 of the reset MOS transistor and the floating diffusion 5, when the reset pulse $\phi_R$ is brought from the high level to the low level, the potential of the floating diffusion 5 sustains a potential drop $\Delta\phi_R$ called a "reset feedthrough noise", which has been explained hereinbefore Referring to FIG. 3, there is shown a circuit diagram of a first embodiment of the floating diffusion type signal charge detection circuit in accordance with the present invention for the charge transfer device, which circuit is configured to minimize the influence of the reset feedthrough noise $\Delta\phi_R$.

In FIG. 3, elements corresponding to those shown in FIG. 1 are given the same Reference Numerals, and explanation thereof will be omitted. In addition, the floating diffusion is depicted in the form of a diode 1, and the reset MOS transistor is depicted in the form of a transistor $Q_1$. An imaginary charge injection point of the floating diffusion is imaginarily shown by Reference Sign P.

The imaginary charge injection point of the floating diffusion is connected to a gate of an enhancement type MOS transistor $Q_2$, which in turn has a drain connected to a high voltage $V_{OD}$, and a source connected to ground through an active load formed of a depletion type MOS transistor $Q_3$, so that a first stage source follower is formed. Therefore, the source of the MOS transistor $Q_2$ forms an output node of the first stage source follower.

The source of the MOS transistor $Q_2$ is also connected to a gate of another enhancement type MOS transistor $Q_4$, which in turn has a drain connected to the high voltage $V_{OD}$, and a source connected to the ground through another active load formed of a depletion type MOS transistor $Q_5$, so that a second stage source follower is formed. The source of the MOS transistor $Q_4$ is also connected to an output terminal Out. In addition, the source of the MOS transistor $Q_2$ is also connected to a drain of a third enhancement type MOS transistor $Q_6$, which in turn has a gate connected to receive the reset pulse $\phi_R$, and a source connected to the ground.

Figure 4:
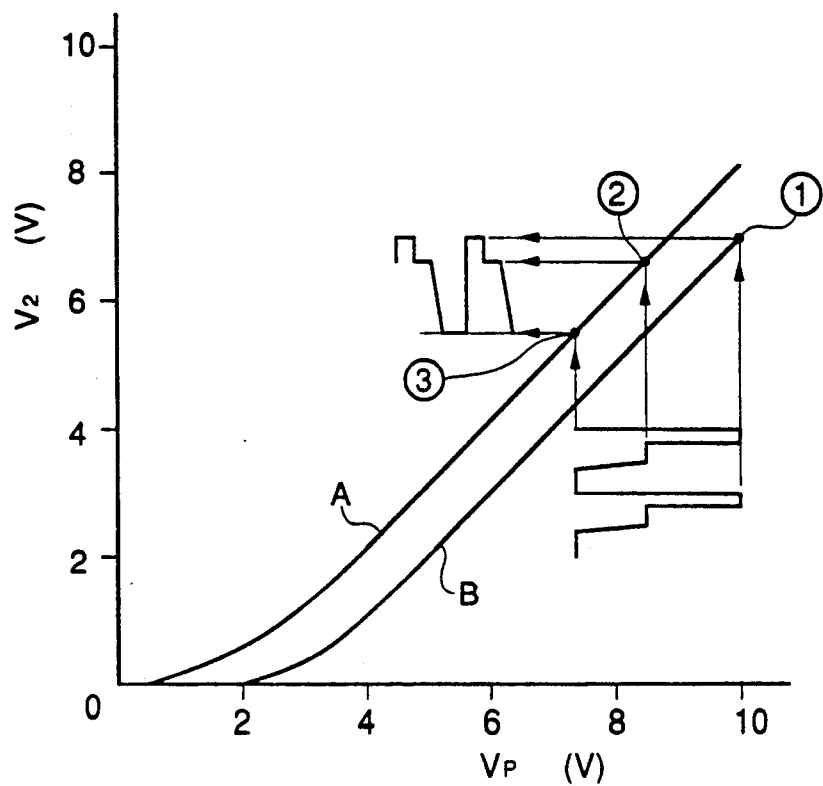
FIG. 4 is a graph illustrating a normal operation zone of the embodiment shown in FIG. 3.

Now, an operation of the shown circuit will be explained with reference to FIG. 4 illustrating an input-to-output characteristics of the first stage source follower. In FIG. 4, a curve A shows a characteristics of an input voltage Vp to an output voltage $V_2$ of the first stage source follower when the reset pulse $\phi_R$ is at the low level and therefore when the MOS transistor $Q_6$ is in an off condition. On the other hand, a curve B shows a characteristics of the input voltage Vp to the output voltage $V_2$ of the first stage source follower when the reset pulse $\phi_R$ is at the high level and therefore when the MOS transistor $Q_6$ is in an on condition. When the MOS transistor $Q_6$ is turned on, a load for the MOS transistor $Q_2$ is composed of a parallel circuit including the MOS transistors $Q_3$ and $Q_6$, and therefore, a total current flowing through the load for the MOS transistor $Q_2$ increases, with the result that an output offset voltage of the first stage source follower is lowered.

Now, assuming that the reset pulse $\phi_R$ is at the high level, the input voltage Vp (voltage of the floating diffusion region) includes the reset feedthrough noise in synchronism with the reset pulse $\phi_R$. In this high level period of the reset pulse $\phi_R$, the MOS transistor $Q_6$ is turned on, so that the first stage source follower is operating at an operating point ① on the curve B in FIG. 4. If the reset pulse $\phi_R$ is brought to the low level, and therefore, if the MOS transistor $Q_6$ is turned off, the operating range (which does not include the reset feedthrough noise component) of the first stage source follower is moved to a range between operating points ② and ③ on the curve A in FIG. 4.

As seen from the above, only when the reset pulse $\phi_R$ is at a high level, the output offset voltage is lowered. Therefore, as shown in FIG. 4, the reset feedthrough noise component $\Delta\phi_R$ appearing in the output voltage $V_2$ is reduced in comparison with the reset feedthrough noise component $\Delta\phi_R$ appearing in the input voltage Vp (at the charge injection point P).

Figure 5:
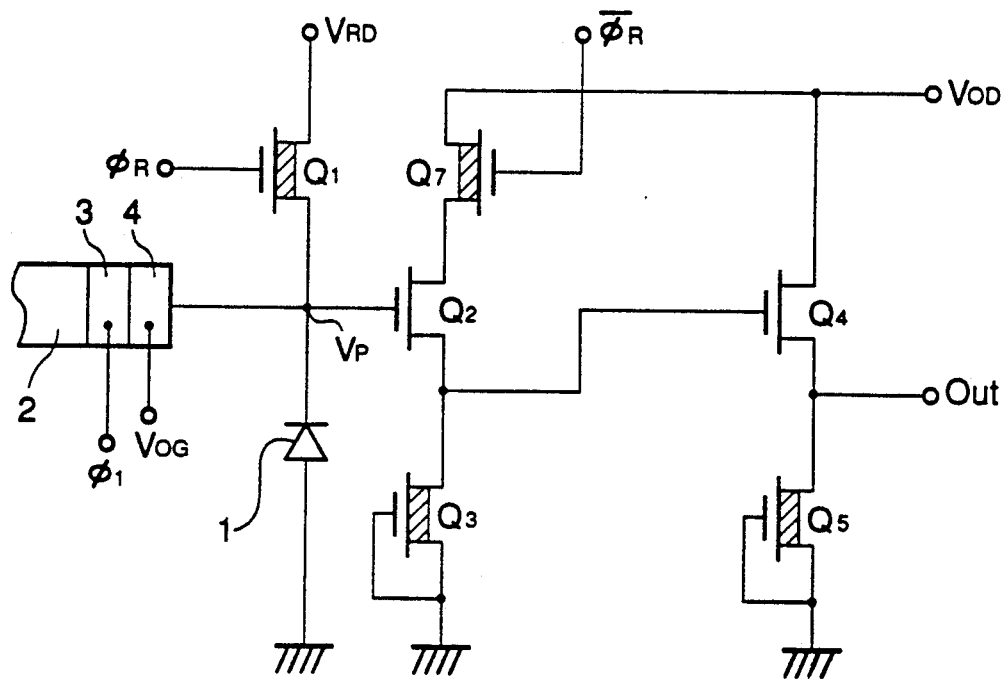
FIGS. 5 and 6 are circuit diagrams of second and third embodiments of the floating diffusion type signal charge detection circuit in accordance with the present invention for the charge transfer device.

Referring to FIG. 5, there is shown a circuit diagram of a second embodiment of the floating diffusion type signal charge detection circuit in accordance with the present invention for the charge transfer device.

In the second embodiment, the MOS transistor $Q_6$ provided in the first embodiment is deleted, a depletion MOS transistor $Q_7$ is connected between the high voltage $V_{OD}$ and the drain of the driving MOS transistor $Q_2$ of the first stage source follower. A gate of the MOS transistor $Q_7$ is connected to receive an inverted signal $\overline{\phi_R}$ of the reset pulse $\phi_R$.

When the reset pulse $\phi_R$ is at the high level, namely, when the inverted signal $\overline{\phi_R}$ is at the low level, the MOS transistor $Q_7$ has a large resistance, and therefore, the source follower composed of the MOS transistors $Q_2$ and $Q_3$ has a lowered output offset voltage. To the contrary, if the reset pulse $\phi_R$ is at the low level, namely, when the inverted signal $\overline{\phi_R}$ is at the high level, the resistance of the MOS transistor $Q_7$ lowers, and therefore, the source follower composed of the MOS transistors $Q_2$ and $Q_3$ has an elevated offset voltage. As a result, the effect similar to that of the first embodiment can be obtained.

Figure 6:
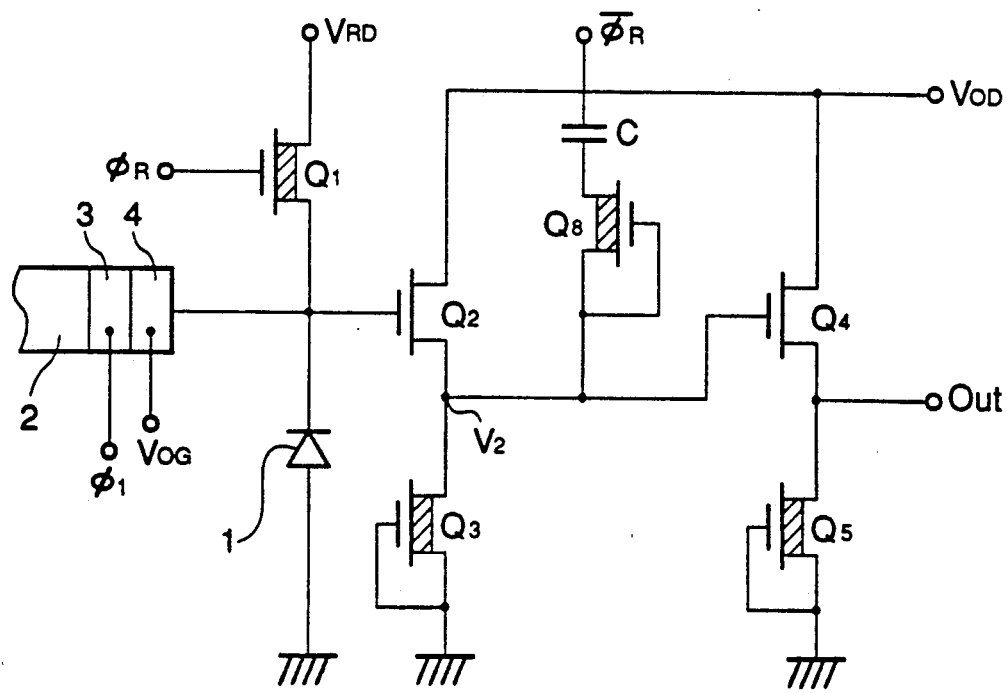

Turning to FIG. 6, there is shown a circuit diagram of a third embodiment of the floating diffusion type signal charge detection circuit in accordance with the present invention for the charge transfer device.

This third embodiment includes a series circuit composed of a capacitor C and a depletion type MOS transistor $Q_8$ connected in the form of an active resistive load and connected to the output node $V_2$ of the first stage source follower. The capacitor C is connected to receive the inverted signal $\overline{\phi_R}$ of the reset pulse $\phi_R$.

With this arrangement, when the reset pulse $\phi_R$ is at the high level, namely, when the inverted signal $\overline{\phi_R}$ is at the low level, the output node $V_2$ of the first stage source follower is lowered. If the reset pulse $\phi_R$ is at the low level, namely, when the inverted signal $\overline{\phi_R}$ is at the high level, the output node $V_2$ of the first stage source follower is elevated. The reset feedthrough noise appearing the input node Vp of the first stage source follower is cancelled at the output node $V_2$ of the first stage source follower. As a result, the effect similar to that of the first embodiment can be obtained.

As seen from the above, the circuit in accordance with the present invention can suppress or cancel the reset feedthrough noise at the output of the first stage source follower. Accordingly, it is possible to realize at a low cost an amplifier for amplifying the output voltage of the source follower to a level adapted to an input level of the A/D converter. In addition, the S/N ratio of the output signal of the charge transfer device can be remarkably improved.

The invention has thus been shown and described with reference to the specific embodiments. However, it should be noted that the present invention is in no way limited to the details of the illustrated structures but changes and modifications may be made within the scope of the appended claims.

I claim:

1. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately from said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage, a source of said first MOS transistor being connected to a first load so that a first source follower is formed, and a second amplification stage having an input connected to said source of said first MOS transistor and an output node connected to an output terminal, and an output control circuit connected to one end of a source-drain path of said first MOS transistor and receiving as a control signal a reset pulse applied to said reset gate so as to be controlled in synchronism with said reset pulse so that when said reset transistor is off, said first source follower outputs a signal having a level higher than that outputted from said first source follower when said reset transistor is on, wherein said second amplification stage includes a second MOS transistor having a gate connected to said source of said first MOS transistor and a drain connected to said high voltage, a source of said second MOS transistor being connected to a second load so that a second source follower is formed, said source of said second MOS transistor being connected to said output terminal.

2. A signal charge detection circuit as claimed in claim 1, wherein said output control circuit includes a MOS transistor having a current path connected in parallel to said first load and a gate connected to receive said reset pulse so that when said reset transistor is on, said MOS transistor of said output control circuit is turned on so as to lower an offset voltage of said first source follower, and when said reset transistor is off, said MOS transistor of said output control circuit is turned off so as to elevate said offset voltage of said first source follower.

3. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately from said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage through a current path of a depletion MOS transistor comprising an output control circuit, a source of said first MOS transistor being connected to a first load so that a first source follower is formed, and a second amplification stage having an input connected to said source of said first MOS transistor and an output node connected to an output terminal, and depletion MOS transistor having a gate receiving as a control signal an inverted version of a reset pulse applied to said reset gate so as to be controlled in synchronism with said reset pulse so that when said reset transistor is off, said first source follower outputs a signal having a level higher than that outputted from said first source follower when said reset transistor is on, wherein when said reset transistor is on, said depletion MOS transistor has an increased resistance so as to lower a source voltage of said first MOS transistor, and when said reset transistor is off, said depletion MOS transistor has a decreased resistance so as to elevate said source voltage of said first MOS transistor.

4. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately from said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage, a source of said first MOS transistor being connected to a first load so that a first source follower is formed, and a second amplification stage having an input connected to said source of said first MOS transistor and an output node connected to an output terminal, and an output control circuit connected to one end of a source-drain path of said first MOS transistor and receiving a control signal so as to be controlled in synchronism with a reset pulse applied to said reset gate so that when said reset transistor is off, said first source follower outputs a signal having a level higher than that outputted from said first source follower when said reset transistor is on wherein said output control circuit includes a series circuit composed of a capacitor and a resistive load, said resistive load being connected to said source of said first MOS transistor, and said capacitor being connected to receive an inverted signal of said reset pulse so that when said reset transistor is on, a source voltage of said first MOS transistor is lowered, and when said reset transistor is off, said source voltage of said first MOS transistor is elevated.

5. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately form said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage, a source of said first MOS transistor being connected to a first load so that a first source follower is formed, and a second amplification stage having an input connected to said source of said first MOS transistor and an output node connected to an output terminal, and an additional circuit connected to one end of a source-drain path of said first MOS transistor and receiving as a control signal a reset pulse applied to said reset gate to be controlled in synchronism with said reset pulse so that when said reset transistor is on, an offset level of the output voltage of said first source follower is lowered to a level which is lower than the offset level when said reset transistor is off, wherein said second amplification stage includes a second MOS transistor having a gate connected to said source of said first MOS transistor and a drain connected to said high voltage, a source of said second MOS transistor being connected to a second load so that a second source follower is formed, said source of said second MOS transistor being connected to said output terminal.

6. A signal charge detection circuit as claimed in claim 5, wherein said additional circuit includes a MOS transistor having a current path connected in parallel to said first load and a gate connected to receive said reset pulse so that when said reset transistor is on, said MOS transistor of said output control circuit is turned on so as to lower an offset voltage of said first source follower, and when said reset transistor is off, said MOS transistor of said output control circuit is turned off so as to elevate said offset voltage of said first source follower.

7. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately form said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage through a current path of a depletion MOS transistor comprising an additional circuit, a source of said first MOS transistor being connected to a first load so that a first source follower is formed, and a second amplification stage having an input connected to said source of said first MOS transistor and an output node connected to an output terminal, and said depletion MOS transistor having a gate receiving as a control signal an inverted version of a reset pulse applied to said reset gate, to be controlled in synchronism with said reset pulse so that when said reset transistor is on, an offset level of the output voltage of said first source follower is lowered to a level which is lower than the offset level when said reset transistor is off, wherein when said reset transistor is on, said depletion MOS transistor has an increased resistance so as to lower a source voltage of said first MOS transistor, and when said reset transistor is off, said depletion MOS transistor has a decreased resistance so as to elevate said source voltage of said first MOS transistor.

8. A floating diffusion type signal charge detection circuit for use in a charge transfer device, said signal charge detection circuit including a charge transfer region formed in a semiconductor layer, a plurality of transfer electrodes formed on said charge transfer region through an insulating layer, a floating diffusion formed in said semiconductor layer adjacent to a final stage of said charge transfer region, a reset drain formed in said semiconductor layer separately form said floating diffusion and connected to a reset drain voltage, a reset gate formed through an insulating layer on a portion of said semiconductor layer between said floating diffusion and said reset drain, said floating diffusion, said reset drain and said reset gate forming a reset transistor, and an amplifier having an input connected to said floating diffusion so as to detect a voltage change appearing in said floating diffusion, said amplifier including a first amplification stage having a first MOS transistor having a gate connected to said floating diffusion and a drain connected to a high voltage, a source of said first MOS transistor being connected to a first load so that a first source follower is formed, and a second amplification stage having an input connected to said source of said first MOS transistor and an output node connected to an output terminal, and an additional circuit connected to one end of a source-drain path of said first MOS transistor and receiving a control signal so as to be controlled in synchronism with a reset pulse applied to said reset gate, so that when said reset transistor is on, an offset level of the output voltage of said first source follower is lowered to a level which is lower than the offset level when said reset transistor is off wherein said additional circuit includes a series circuit composed of a capacitor and a resistive load, said resistive load being connected to said source of said first MOS transistor, and said capacitor being connected to receive as said control signal an inverted signal of said reset pulse so that when said reset transistor is on, a source voltage of said first MOS transistor is lowered, and when said reset transistor is off, said source voltage of said first MOS transistor is elevated.

* * * * *